United States Patent [19]
Nakamura et al.

[11] Patent Number: 5,897,049
[45] Date of Patent: Apr. 27, 1999

[54] METHOD FOR WIRE-BONDING A COVERED WIRE

[75] Inventors: Osamu Nakamura, Kokubunji; Kazumasa Sasakura, Musashi Murayama, both of Japan

[73] Assignee: Kabushiki Kaisha Shinkawa, Tokyo, Japan

[21] Appl. No.: 08/759,231

[22] Filed: Dec. 5, 1996

[30] Foreign Application Priority Data

Dec. 5, 1995 [JP] Japan ................................ 7-344551

[51] Int. Cl.⁶ .................................................. H01L 21/60
[52] U.S. Cl. ................................... 228/180.5; 219/56.22
[58] Field of Search ............................... 228/4.5, 180.5; 219/56.21, 56.22

[56] References Cited

U.S. PATENT DOCUMENTS 5,176,310  1/1993  Akiyama et al. .................... 228/4.5
5,370,300  12/1994  Okumura ............................ 228/4.5

FOREIGN PATENT DOCUMENTS 2-146742  6/1990  Japan ................................. 219/56.21
2-213146  8/1990  Japan ..................................... 228/4.5

*Primary Examiner*—Patrick Ryan
*Assistant Examiner*—Jeffrey T. Knapp
*Attorney, Agent, or Firm*—Koda & Androlia

[57] ABSTRACT

To assure the continuity of bonding by preventing any buckling of a covered wire or slipping-off of the covered wire from a second clamper, the second clamper is caused to vibrate while a capillary and first clamper are being raised to a ball formation level after the first clamper is closed and the second clamper is opened in the step of raising the capillary and first clamper to the ball formation level, thus preventing the covered wire from sticking to the second clamper.

2 Claims, 4 Drawing Sheets

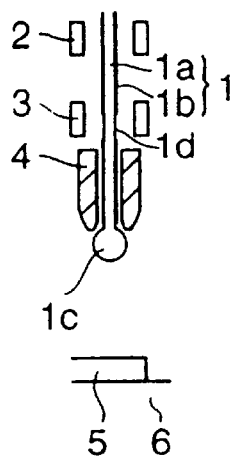 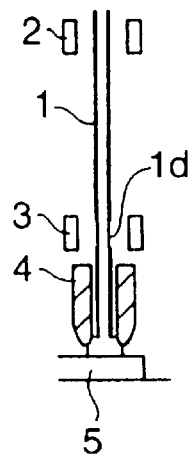 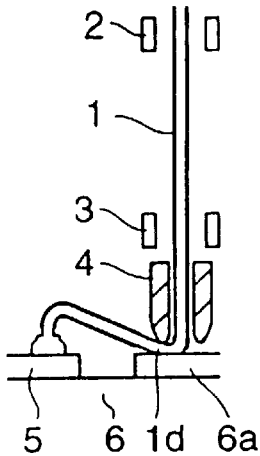 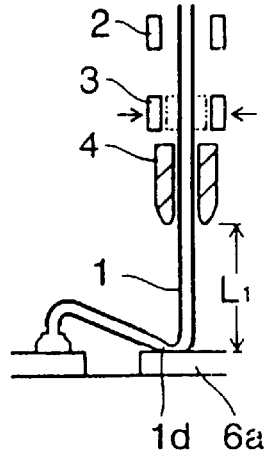
FIG. 1(a)　FIG. 1(b)　FIG. 1(c)　FIG. 1(d)
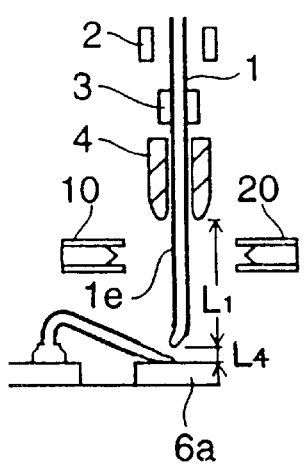 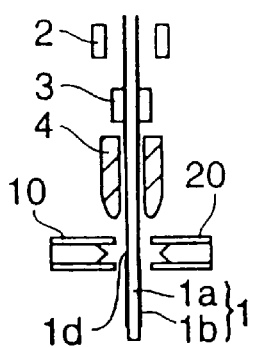 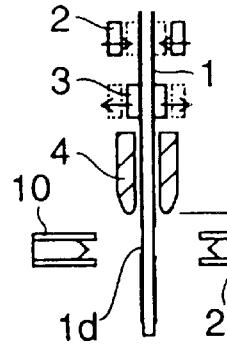 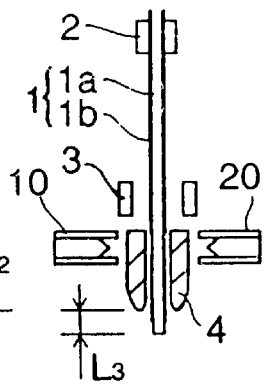
FIG. 1(e)　FIG. 1(f)　FIG. 1(g)　FIG. 1(h)
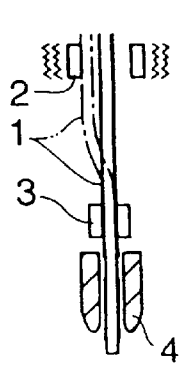 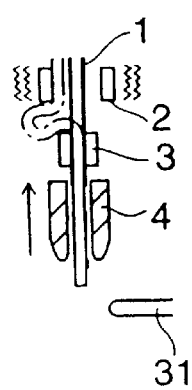 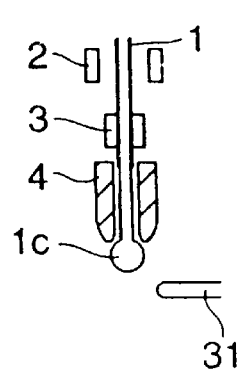
FIG. 1(i)　FIG. 1(j)　FIG. 1(k)

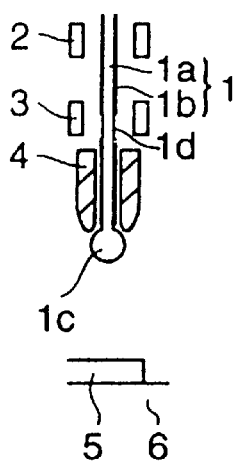
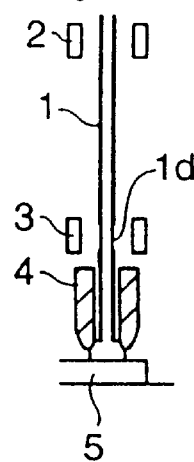
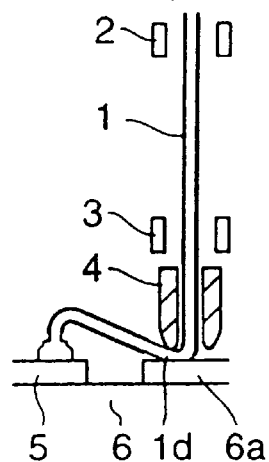
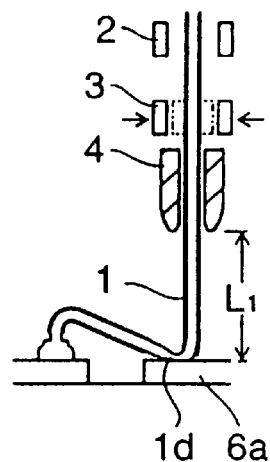
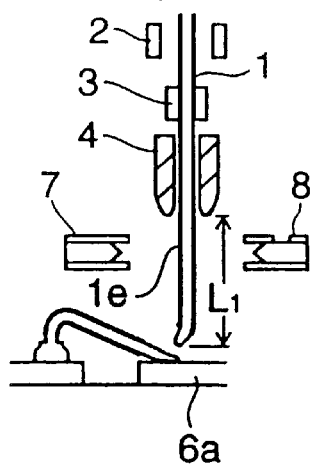
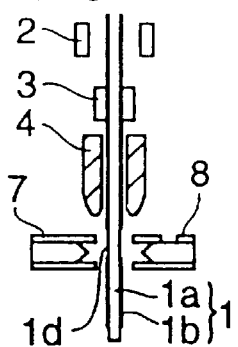
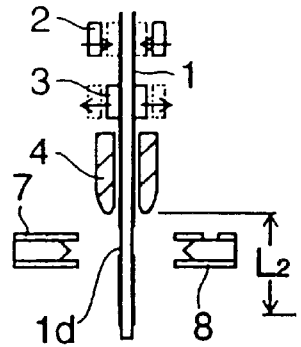
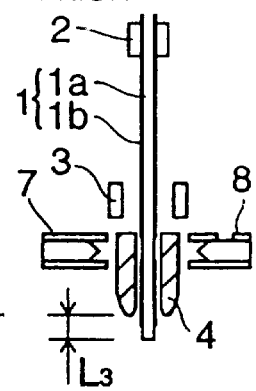
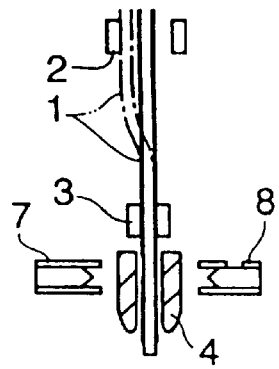
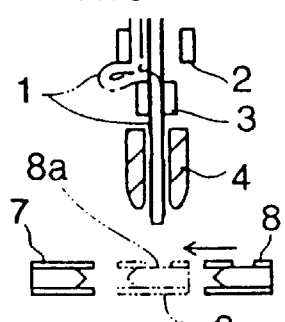
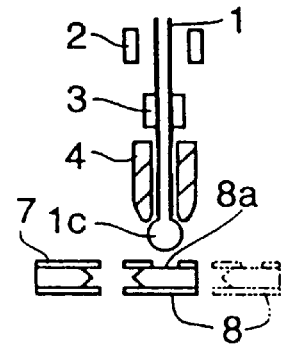

METHOD FOR WIRE-BONDING A COVERED WIRE

BACKGROUND OF THE INVENTION

1. Field of the Invention

The present invention relates to a method for wire-bonding a covered wire.

2. Prior Art

Conventionally, as a method for wire-bonding a covered wire, a method disclosed in Japanese Patent Application Laid-Open (Kokai) No. 2-213146 has been known. This method is disclosed in FIG. 6. A covered wire 1 is comprised of a core wire 1a, which is a conductor, and a covering-film 1b, which consists of a macromolecular resin material with electrical insulating properties and is covered as a coating around the circumference of the core wire 1a. The covered wire 1 is supplied from a wire spool, which is not shown in the Figures, and passed through a capillary 4 via a second clamper 2, which is for holding the wire, and a first clamper 3, which is for cutting the wire. The covered wire 1 thus passing through the capillary 4 is connected to the pad of a semiconductor pellet 5 and the lead 6a of a lead frame 6.

A pair of discharge electrodes 7 and 8 for removing the covering-film and for forming a ball include, as shown in FIG. 5, electromagnetic parts 71 and 81 as discharge terminals, and the upper and lower surfaces of the electromagnetic parts 71 and 81 are held by insulating parts 72 and 82 which have electrical insulating properties. Here, one of the discharge electrodes 7 is used exclusively for removing the covering-film 1b, while the other discharge electrode 8 functions as a dual-purpose electrode so that it is used both for removing the covering-film 1b and for forming a ball. As a result, the upper surface of the discharge electrode 8 has a structure provided with an exposed discharge surface, and this exposed portion functions as an electrode surface 8a for forming a ball.

FIG. 6(a) shows a state in which a ball 1c has been formed at the tip of the covered wire 1, and the first clamper 3 and second clamper 2 are opened. Furthermore, a removed portion (exposed portion 1d) has been formed beforehand by a method which will be described below in an area extending for a predetermined distance from the tip of the covered wire 1. As seen from FIGS. 6(a) to 6(b), the capillary 4 is lowered so that the ball 1c is bonded to the first bonding point of a pad of the semiconductor pellet 5. Next, the capillary 4 is raised, moved to a point above one of the leads 6a of the lead frame 6 and then lowered; and as shown in FIG. 6(c), the exposed portion 1d is bonded to the second bonding point of the lead 6a.

Next, as shown in FIG. 6(d), the capillary 4 is raised by a distance $L_1$ from the surface of the lead 6a. This distance $L_1$ is calculated by use of information concerning the first and second bonding positions and the initial set conditions of the bonding apparatus, etc., as described in Japanese Patent Application Laid-Open No. 2-213146. When the first clamper 3 and the capillary 4 are thus raised by a distance $L_1$, the first clamper 3 closes and holds the covered wire 1. Next, with the first clamper 3 closed, the clamper 3 is raised together with the capillary 4; and as shown in FIG. 6(e), the covered wire 1 is cut from the base area of the second bonding point. In this case, the first clamper 3 and the capillary 4 are raised so that an intended covering-film removal area 1e comes between the pair of discharge electrodes 7 and 8. As result, the covered wire 1 protrudes from the tip of the capillary 4 by the length $L_1$, and a part of the exposed portion 1d remains at the tip of the covered wire 1.

Next, as shown in FIG. 6(f), the pair of discharge electrodes 7 and 8 are moved in close to the covered wire 1 from both sides in a non-contact state. A voltage is then applied to the discharge electrodes 7 and 8 so that an electric discharge is caused to take place between the electromagnetic parts 71 and 81 and the core wire 1a with the covering-film 1b in between. As a result of the discharge energy, as shown in FIG. 6(g), a portion of the covering-film 1b located at a predetermined position on the covered wire 1 is removed. In other words, the exposed portion 1d shown in FIG. 6(a) is formed. Next, as shown in FIG. 6(g), the discharge electrodes 7 and 8 are withdrawn in a direction away from the covered wire 1.

Next, as shown by the chain lines, the second clamper 2 is closed, and the first clamper 3 is opened. Afterward, as shown in FIG. 6(h), the first clamper 3 and the capillary 4 are lowered, in relative terms, by a distance $L_2$ from the state shown in FIG. 6(g). In this case, since the covered wire 1 is held (restrained) by the second clamper 2, the covered wire 1 is brought into the interior of the capillary 4 by a distance $L_2$, so that the tip of the covered wire 1 protrudes from the tip of the capillary 4 by a tail length $L_3$. In this case, the tail length $L_3$ of the tip of the covered wire 1 corresponds to a part of the exposed portion 1d, from which the covering-film 1b has been removed.

Next, as shown in FIG. 6(i), the first clamper 3 is closed, and the second clamper 2 is opened; and the capillary 4 is raised to a ball forming level as shown in FIG. 6(j). Next, as shown by chain lines, the discharge electrode 8 is moved so that the electrode surface 8a for ball formation is positioned directly beneath the tip of the covered wire 1. Then, as shown in FIG. 6(k), a high voltage is applied across the discharge electrode 8 and covered wire 1, thus forming the ball 1c. Next, as shown by the chain lines, the discharge electrode 8 is returned to its original position. Then, the first clamper 3 is opened, and the capillary 4 is positioned above the next bonding point (see FIG. 6(a)). Afterward, the series of operations shown in FIGS. 6(a) through (k) are repeated.

The covering-film 1b of the covered wire 1 is made of a macromolecular resin material having electrical insulating properties such as a polyurethane, polyvinyl formal, polyester, etc., or of a resin material combining such resins. Accordingly, the covering-film 1b has a certain degree of weak adhesive properties; and when the second clamper 2 is opened as shown in FIGS. 6(h) and 6(i), the covered wire 1 may stick to the clamping surface of the second clamper 2 as indicated by the chain lines. If the first clamper 3 and the capillary 4 are raised as shown in FIG. 6(j) while the covered wire 1 remains stuck to the second clamper 2, the covered wire 1 may buckle flex in the direction parallel to the clamping surfaces of the second clamper 2 so that the covered wire 1 slips out of the second clamper 2, thus interfering with the continuity of bonding.

SUMMARY OF THE INVENTION

The object of the present invention is to provide a method for wire-bonding a covered wire which assures the continuity of bonding by preventing buckling of a covered wire or slipping-off of a covered wire from a second clamper.

The first means of the present invention which solves the above-described problems is characterized in that in a method for wire-bonding a covered wire and comprises the steps of:

removing a covering-film located in an intended covering-film removal area of the covered wire which extends out from the tip of a capillary, closing a second clamper and opening a first clamper, and then lowering the capillary and first clamper so that the covered wire extending out from the tip of the capillary is brought into the interior of the capillary, thus leaving the tip of the covered wire to protrude from the tip of the capillary by only a tail length, closing the first clamper and opening the second clamper, and then raising the capillary and first clamper to a ball formation level, and forming a ball at the tip of the covered wire;

the second clamper is caused to vibrate while the capillary and the first clamper are being raised to the ball formation level after the first clamper is closed and the second clamper opened in the step of raising the capillary and first clamper to the ball formation level, thus preventing the covered wire from sticking to the second clamper.

The second means of the present invention which solves the above-described problems is characterized in that in a method for wire-bonding a covered wire and comprises the process which involves:

the steps of:

performing a second bonding operation on a second bonding point, raising a capillary and first clamper by a predetermined amount, closing the first clamper, and raising the capillary and first clamper so as to cut the covered wire from the base of the second bonding point, and raising the capillary and first clamper so that an intended covering-film removal area of the covered wire extending from the tip of the capillary faces a discharge electrode; and the steps of:

removing the covering-film located at the intended covering-film removal area of the covered wire extending from the tip of the capillary, closing the second clamper and opening the first clamper, and then lowering the capillary and first clamper so that the covered wire extending from the tip of the capillary is brought into the interior of the capillary, thus leaving the tip of the covered wire to protrude from the tip of the capillary by only a tail length, closing the first clamper and opening the second clamper, and then raising the capillary and the first clamper to a ball formation level, and forming a ball at the tip of the covered wire;

the second clamper is caused to vibrate while the capillary and the first clamper are being raised so that the intended covering-film removal area of the covered wire faces the discharge electrode after the first clamper is closed in the step in which the intended covering-film removal area of the covered wire faces the discharge electrode, thus preventing the covered wire from sticking to the second clamper, and the second clamper is caused to vibrate while the capillary and the first clamper are being raised to the ball formation level after the first clamper is closed and the second clamper opened in the step of raising the capillary and first clamper to the ball formation level, thus preventing the covered wire from sticking to the second clamper.

BRIEF DESCRIPTION OF THE DRAWINGS

FIG. 1 is an explanatory set of diagrams which illustrate one embodiment of the method for wire-bonding a covered wire of the present invention;

FIG. 4 shows one example of the discharge electrodes; wherein

FIG. 5 shows another example of discharge electrodes; wherein FIG. 6 is an explanatory set of diagrams which illustrate a conventional method for wire-bonding a covered wire.

DETAILED DESCRIPTION OF THE INVENTION

Figure 2:
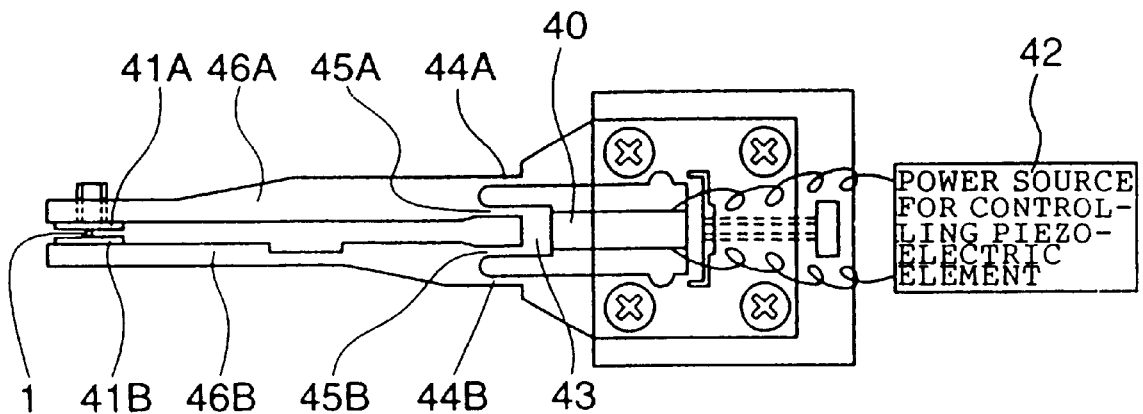
FIG. 2 shows a top view which shows one example of the second clamper.

One manner of practice of the present invention will be described with reference to FIG. 1. In this manner of practice, the covered wire 1 is prevented from sticking to the second clamper 2 at the time the first clamper 3 is closed and the second clamper 2 is opened as shown in FIG. 1(i), and the covered wire 1 is prevented from buckling or slipping off from the second clamper 2 at the time the capillary 4 and the first clamper 3 are subsequently raised.

More specifically, after the first clamper 3 is closed and the second clamper 2 is opened as shown in FIG. 1(i), a vibration is applied to the second clamper 2 until the first clamper 3 and the capillary 4 are raised as shown in FIG. 1(j). As a result, even if the covered wire 1 should stick to the second clamper 2 as indicated by the chain lines, the covered wire 1 is released from the second clamper 2 by the vibration of the second clamper 2. Accordingly, when the capillary 4 and the first clamper 3 are subsequently raised to a ball formation level as shown in FIG. 1(j), buckling of the covered wire, as indicated by the chain lines, and slipping-off of the covered wire 1 from the second clamper 2 are prevented.

In another manner of practice of the present invention, if the covered wire 1 sticks to the clamping surface of the second clamper 2 when the first clamper 3 closes as shown in FIG. 1(d) and the capillary 4 and the first clamper 3 are raised as shown in FIG. 1(e), there is a danger that this will cause buckling of the covered wire 1. However, the other manner of practice of the present invention prevents such buckling of the covered wire 1 and slipping-off of the covered wire 1 from the second clamper 2.

More specifically, as shown in FIG. 1(d), the first clamper 3 closes and holds the covered wire 1, and then it is raised together with the capillary 4 in this closed state, so that the covered wire 1 is cut from the base area of the second bonding point as shown in FIG. 1(e). This operation is the same as in a conventional method. However, in the other manner of practice of the present invention, after the first clamper 3 has closed as shown in FIG. 1(d), the second clamper 2 is caused to vibrate until the first clamper 3 and the capillary 4 have been risen so that an intended covering-film removal area 1e faces the discharge electrodes 10 and 20 as shown in FIG. 1(e). As a result, even if the covered wire 1 should stick to the second clamper 2, the covered wire 1 is released from the second clamper 2 by the vibration of the second clamper 2.

Figure 4A:
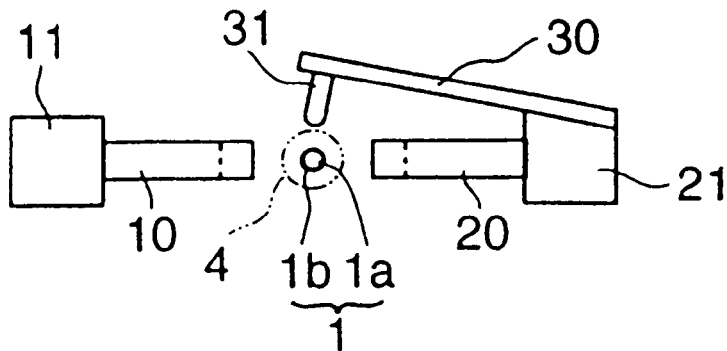
FIG. 4(a) is a top view thereof.
Figure 4B:
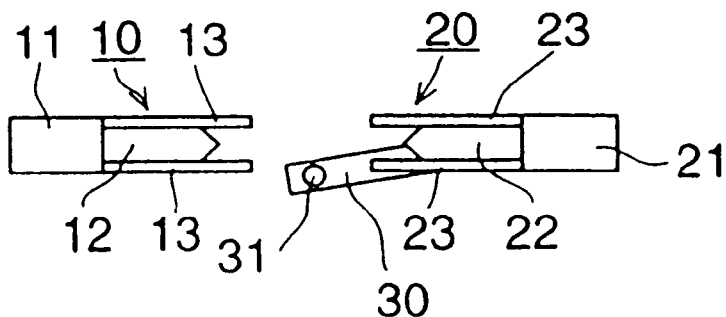
FIG. 4(b) is a front view thereof.
Figure 5A:
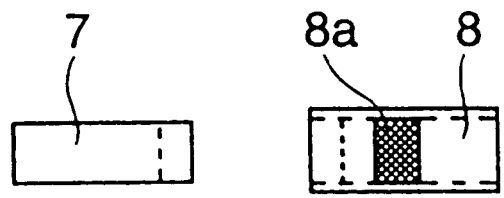
FIG. 5(a) is a top view thereof.
Figure 5B:
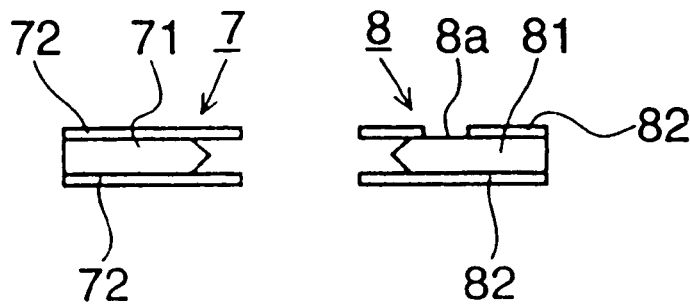
FIG. 5(b) is a front view thereof.

An embodiment of the present invention is described with reference to FIGS. 1 and 4. Elements which are the same as in FIGS. 5 and 6 or correspond to elements in FIGS. 5 and 6 will be labeled with the same reference numerals. In this embodiment, the discharge electrodes as shown in FIG. 4 is employed. As shown in FIG. 4, a pair of discharge electrodes 10 and 20 are fastened to respective electrode arms 11 and 21 and are driven toward and away from the covered wire 1 by a driving means which is not shown in the Figures. The discharge electrodes 10 and 20 have electromagnetic parts 12 and 22 as discharge terminals, and the upper and lower surfaces of these electromagnetic parts 12 and 22 are sandwiched by insulating parts 13, 13 and 23, 23. Conventionally, as shown in FIG. 5, an electrode surface 8a for ball formation, which is an exposed discharge surface, is formed on the upper surface of one of the discharge electrodes 8. However, in the discharge electrodes 10 and 20 shown in FIG. 4, no such electrode surface 8a for ball formation is formed. In other words, the pair of discharge electrodes 10 and 20 are used exclusively for removing the covering-film 1b. Below, the discharge electrodes 10 and 20 will be referred to as "discharge electrodes for covering-film removal".

An electrode arm 30 is fastened to one of the electrode arms 20, and a discharge electrode 31 for ball formation is installed at the tip portion of the electrode arm 30. The discharge electrode 31 for ball formation is provided so as to be positioned to one side of the covered wire 1 at the time the discharge electrodes 10 and 20 are moved away from the covered wire 1 by a certain distance, for example, approximately 0.9 mm from the center of the covered wire 1 when the radius of the capillary 4 is 0.8 mm.

The clamper described in Japanese Patent Application Laid-Open (Kokai) No. 6-260524 is used, as an example, as the second clamper 2. The structure of this clamper is shown in FIG. 2. When no voltage is applied to a laminated piezoelectric actuator (hereafter referred to as a "piezoelectric element") 40, clamping elements 41A and 41B hold the covered wire 1, which is not shown, with a predetermined clamping load. Then, when a voltage is applied to the piezoelectric element 40 by a piezoelectric element power supply 42, the piezoelectric element 40 extends toward the clamping elements 41A and 41B as a result of an electrostriction or magnetostriction effect, thus causing an operating part 43 to move in the same direction (i. e., to the left). As a result, neck portions 44A, 44B, 45A and 45B flex outward, so that arms 46A and 46B open outward, thus placing the clamping elements 41A and 41B, that is, the second clamper 2, in an open state. The amount of movement of the clamping elements 41A and 41B is equal to the amount of extension of the piezoelectric element 40 amplified by the ratio of the distance between the operating portion 43 and the neck portions 44A and 44B to the distance between the neck portions 44A and 44B and the surfaces of the clamping elements 41A and 41B that hold the covered wire 1.

Figure 3:
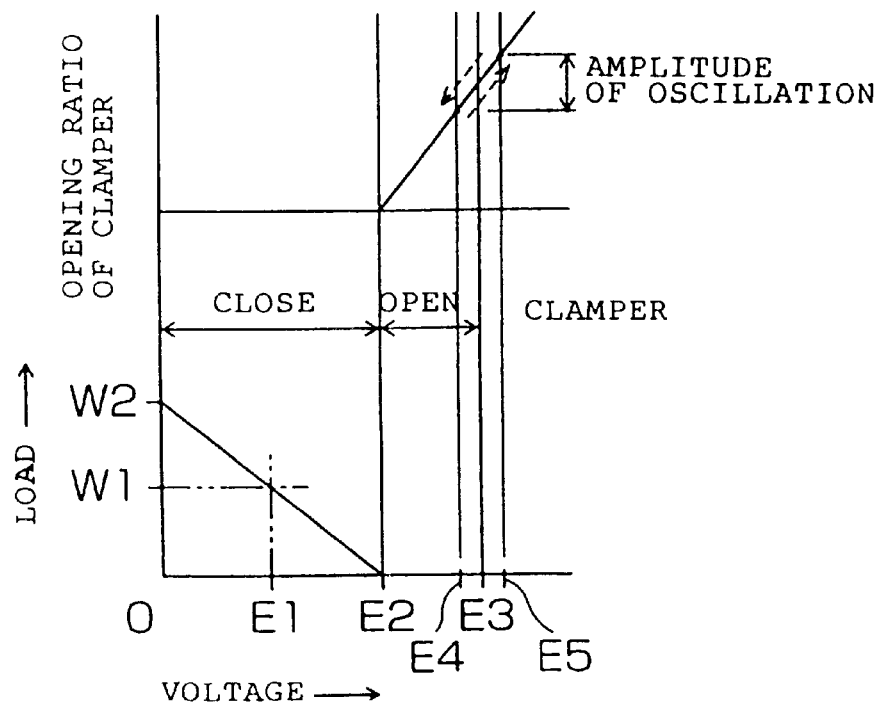
FIG. 3 is a graph which shows the relationship of the voltage applied to the piezoelectric element, the clamping load and the degree of opening of the clamper.

The above-described phenomena are described in greater detail. When a voltage is applied to the piezoelectric element 40 beginning in a state in which the voltage applied to the piezoelectric element 40 is 0 (zero) and the clamping load is W2, the clamping load is decreased in proportion to the voltage applied as shown in FIG. 3. Then, when the applied voltage reaches E2, the clamper assumes a state in which the clamping elements 41A and 41B are in contact with the covered wire 1, but the clamping load is zero. When the voltage is increased even further, the clamping elements 41A and 41B are separated from the covered wire 1, and the clamper opens. Accordingly, in the case of actual covered-wire bonding, the clamping load W1 which is desired when the covered wire 1 is to be clamped is obtained by a voltage of E1. In view of the above, a desired clamping load can be set by measuring the relationship between voltage and clamping load beforehand, and lowering the voltage by a predetermined amount from the voltage value where the clamping elements 41A and 41B just contact the covered wire 1, i. e., the voltage value where the clamping load is zero.

Accordingly, under actual use conditions, the voltage is set at E1 when the covered wire is held, and the voltage is set at E3 when the covered wire is released. To indicate one concrete example, the wire clamper may be designed so that when the applied voltage is zero, the clamping load W2 is approximately 80 to 100 g, and so that when the voltage E3 is 100 V, the clamping elements 41A and 41B are separated from the covered wire 1 by a distance of approximately 50 to 70 $\mu$m; and the wire clamper is set so that when the voltage E1 is approximately 50 to 60 V, the clamping load W1 is approximately 40 to 50 g.

Next, the method for wire-bonding a covered wire will be described with reference to FIG. 1. Since FIGS. 1(a) through 1(e) are identical to FIGS. 6(a) through 6(e), a description of the processes illustrated in these Figures are omitted. Though FIGS. 1(f) through 1(i) are almost identical to FIGS. 6(f) through 6(i), the processes illustrated in these Figures will be described briefly. As shown in FIG. 1(e), the covered wire 1 is cut at the base area of the second bonding point. In this case, the first clamper 3 and the capillary 4 are raised by the distance L4 so that the intended covering-film removal area 1e of the covered wire 1 is positioned between the pair of discharge electrodes 10 and 20. Then, as shown in FIG. 1(f), the pair of discharge electrodes 10 and 20 for covering-film removal are moved in close to the covered wire 1 in a non-contact state from both sides, and a voltage is applied to the discharge electrodes 10 and 20 for covering-film removal, so that a portion of the covering-film 1b at a predetermined position of the covered wire 1 is, as in the prior art, removed, forming an exposed portion 1d.

Next, as shown in FIG. 1(g), the discharge electrodes 10 and 20 for covering-film removal are withdrawn from the covered wire 1 and then caused to return to their original positions. When the discharge electrodes 10 and 20 for covering-film removal return to their original positions, the discharge electrode 31 for ball formation is moved together with the discharge electrodes 10 and 20 for covering-film removal and is positioned to one side of the covered wire 1 as shown in FIG. 4(a). Next, as shown by the chain lines, the second clamper 2 is closed and the first clamper 3 is opened; after which the capillary 4 is lowered in relative terms by a distance $L_2$ from the state shown in FIG. 3(h). As a result, the covered wire 1 is brought into the interior of the capillary 4 by a distance $L_2$, so that the tip of the covered wire 1 protrudes from the tip of the capillary 4 by a tail length of $L_3$.

Next, as shown in FIG. 1(i), the first clamper 3 is closed and the second clamper 2 is opened. Then, as shown in FIG. 1(j), the capillary 4 and first clamper 3 are raised to the ball formation level. In this case, the tip of the covered wire 1 moves until the tip is positioned beside the discharge electrode 31 used for ball formation. In the present embodiment, a vibration is applied to the second clamper 2 from the time that the first clamper 3 is closed and the second clamper 2 is opened as shown in FIG. 1(i) until the capillary 4 and first clamper 3 are raised as shown in FIG. 1(j). As a result, any sticking of the covered wire 1 to the second clamper 2 as indicated by the chain lines is released. Accordingly, when the capillary 4 and first clamper 3 are raised to the ball formation level as shown in FIG. 1(j), buckling of the covered wire 1 as indicated by the chain lines, or slipping-off of the covered wire 1 from the second clamper 2 can be prevented.

Next, as shown in FIG. 1(k), a high voltage is applied to the discharge electrode 31 for ball formation and covered wire 1, so that a ball 1c is formed. Next, the first clamper 3 is opened, and the capillary 4 is positioned above the next bonding point (see FIG. 1(a)). Afterward, the above-described series of operations shown in FIGS. 1(a) through 1(k) is repeated.

The method used to apply a vibration to the second clamper 2 is described with reference to FIGS. 2 and 3. When a voltage of E3 is applied to the piezoelectric element 40, the clamping elements 41A and 41B are opened, i. e., the second clamper 2 opens. For example, when, as described above, the voltage E is 100 V, the clamping elements 41A and 41B are separated from the covered wire 1 by a distance of approximately 50 to 70 μm. Accordingly, with the clamping elements 41A and 41B in an open state, a voltage E4 (e. g., 90 V) which is smaller than the aforementioned voltage E3, and a voltage E5 (e. g., 110 V) which is larger than the above-described voltage E3, are applied to the piezoelectric element 40 with a cycle of 50 Hz to 5 KHz. As a result, the clamping elements 41A and 41B, i. e., the second clamper 2, are caused to undergo a minute vibration in an open state. In actuality, it is preferable that the cycle of the voltage be 500 Hz to 2 KHz.

Meanwhile, processes in which the first clamper 3 is closed and caused to be raised while holding the covered wire 1 also occurs in the steps shown in FIGS. 1(d) and 1(e). In other words, if the covered wire 1 sticks to the clamping surfaces of the second clamper 2 in the state shown in FIG. 1(d), there is a danger that this may cause buckling, etc., of the covered wire 1 when the capillary 4 and first clamper 3 are raised as shown in FIG. 1(e).

More specifically, as shown in FIG. 1(d), when the first clamper 3 is closed and raised together with the capillary 4 while holding the covered wire 1, the covered wire is cut from the base of the second bonding point as shown in FIG. 1(e). This operation is the same as in a conventional method. However, in the present embodiment, a vibration is applied to the second clamper 2 by the same method as that described above from the time that the first clamper 3 is closed as shown in FIG. 1(d) until the capillary 4 and first clamper 3 are raised as shown in FIG. 1(e). As a result, even if the covered wire 1 should stick to the second clamper 2, the covered wire 1 is released from the second clamper 2 by the vibration of the second clamper 2. However, the distance the capillary 4 and first clamper 3 are raised in this process is smaller than that in the steps shown in FIGS. 1(i) and 1(j), the effect on the covered wire 1 is smaller than the case described previously.

In the above embodiments, the discharge electrodes 10 and 20 shown in FIG. 4 are used. However, since the structure of the discharge electrodes has no direct connection with the gist of the present invention, it is indeed possible to use the discharge electrodes 7 and 8 shown in FIG. 5, or to use some other discharge electrodes. Moreover, the opening and closing operation of the second clamper 2 is not limited to the structure shown in FIG. 2. For instance, it is also possible to use a structure in which the opening and closing operation of the arm portions is accomplished by solenoids.

According to the present invention, any sticking of the covered wire to the second clamper that might occur in the process in which the capillary and first clamper are raised to the ball formation level is released by causing the second clamper to vibrate while the capillary and first clamper are raised to the ball formation level after the first clamper is closed and the second clamper is opened. Accordingly, the covered wire is prevented from buckling or slipping-off from the second clamper.

I claim:

1. A method for wire-bonding a covered wire comprising a process which includes the steps of:

removing a covering-film located at an intended covering-film removal area of the covered wire which extends out from a capillary, closing a second clamper and opening a first clamper, and lowering the capillary and first clamper so as to bring the covered wire extending out from the tip of the capillary into the interior of the capillary, thus leaving the tip of the covered wire to protrude from the tip of the capillary by only a tail length, closing the first clamper and opening the second clamper, and raising the capillary and first clamper to a ball formation level, and forming a ball at the tip of the covered wire;

wherein the second clamper is caused to vibrate while the capillary and first clamper are being raised to the ball formation level after the first clamper is closed and the second clamper is opened in the step of raising the capillary and first clamper to the ball formation level, thus preventing the covered wire from sticking to the second clamper.

2. A method for wire-bonding a covered wire comprising the process which includes:

the steps of:

performing a second bonding operation on a second bonding point:

raising a capillary and a first clamper by a predetermined amount, closing the first clamper, and raising the capillary and first clamper so as to cut the covered wire from a base of the second bonding point, and raising the capillary and first clamper so that an intended covering-film removal area of the covered wire extending from the tip of the capillary faces a discharge electrode, and the steps of:

removing a covering-film located at the intended covering-film removal area of the covered wire extending from the tip of the capillary, closing a second clamper and opening the first clamper, and lowering the capillary and first clamper so as to bring the covered wire extending from the tip of the capillary into the interior of the capillary, thus leaving the tip of the covered wire to protrude from the tip of the capillary by only a tail length, closing the first clamper and opening the second clamper, and raising the capillary and first clamper to a ball formation level, and forming a ball at the tip of the covered wire;

wherein the second clamper is caused to vibrate while the capillary and first clamper are being raised so that the intended covering-film removal area of the covered wire faces the discharge electrode after the first clamper is closed in the step of having the intended covering-film removal area of the covered wire face the discharge electrode, thus preventing the covered wire from sticking to the second clamper, and the second clamper is caused to vibrate while the capillary and the first clamper are being raised to the ball formation level after the first clamper is closed and the second clamper is opened in the step of raising the capillary and first clamper to the ball formation level, thus preventing the covered wire from sticking to the second clamper.

* * * * *